United States Patent [19]

Banks

[11] Patent Number: 4,565,618

[45] Date of Patent: Jan. 21, 1986

[54] APPARATUS FOR PRODUCING DIAMONDLIKE CARBON FLAKES

[75] Inventor: Bruce A. Banks, Olmsted Township, Cuyahoga County, Ohio

[73] Assignee: The United States of America as represented by the Administrator of the National Aeronautics and Space Administration, Washington, D.C.

[21] Appl. No.: 668,433

[22] Filed: Nov. 5, 1984

Related U.S. Application Data

[63] Continuation-in-part of Ser. No. 591,089, Mar. 19, 1984, Pat. No. 4,495,044, which is a continuation-in-part of Ser. No. 495,381, May 17, 1983, Pat. No. 4,437,962.

[51] Int. Cl.[4] .............................................. C23C 14/00
[52] U.S. Cl. ................................. 204/298; 204/192 C; 219/121 PL; 219/121 PM; 219/121 PQ; 219/121 PR; 219/121 PG; 219/121 P; 219/121 EE; 219/121 EM; 427/38; 427/39; 427/34; 427/35
[58] Field of Search ............................ 204/192 C, 298; 219/121 PL, 121 PM, 121 PQ, 121 PR, 121 PG, 121 P, 121 E, 121 EE, 121 EM; 427/38–39, 34–35

[56] References Cited

U.S. PATENT DOCUMENTS

| 3,904,505 | 9/1975 | Aisenberg | 204/298 |
| 4,386,258 | 5/1983 | Akashi et al. | 219/121 PM |
| 4,490,229 | 12/1984 | Mirtich et al. | 204/192 C |

OTHER PUBLICATIONS

"Gaseous Conductors", by J. D. Cobine, Dover Publications, 1941, pp. 300–303, 596–597.

Primary Examiner—R. L. Andrews
Attorney, Agent, or Firm—Gene E. Shook; John R. Manning

[57] ABSTRACT

A vacuum arc between a spot 42 at the face of a graphite cathode 30 and a graphite anode 32 produces a beam 28 of carbon ions and atoms. This beam deposits a carbon coating on an ion beam sputtered target to produce diamondlike carbon flakes.

A graphite tube 40 encloses the cathode, and electrical isolation is provided by an insulating sleeve 38. The tube 40 forces the vacuum arc spot to be confined to the surface on the outermost end of the cathode.

Without the tube 40 the arc spot will wander to the side of the cathode. This spot movement results in low rates of carbon deposition, and the properties of the deposited flakes are more graphitelike than diamondlike.

18 Claims, 3 Drawing Figures

APPARATUS FOR PRODUCING DIAMONDLIKE CARBON FLAKES

ORIGIN OF THE INVENTION

The invention described herein was made by an employee of the United States Government and may be manufactured or used by or for the Government without the payment of any royalties thereon or therefor.

STATEMENT OF COPENDENCY

This application is a continuation-in-part of application Ser. No. 591,089 filed Mar. 19, 1984 and now U.S. Pat. No. 4,495,044, which is a continuation-in-part of application Ser. No. 495,381, filed May 17, 1983 and now U.S. Pat. No. 4,437,962.

TECHNICAL FIELD

This invention is concerned with producing diamondlike carbon flakes. The properties of the flakes produce desirable thermal, electrical, mechanical, and tribological properties when used in aerospace structures and components. These diamondlike carbon flakes are particularly useful as a filler material in a composite.

Previous composite materials were made from fibers, fiber bundles, and woven fiber bundles as the strength providing component in a composite material. Fibers of graphite, boron, tungsten, and glass have been used frequently in conjunction with various organic and metallic binders. Oftentimes these materials did not have the high tensile strength and other properties required of the composite material.

Diamondlike carbon flakes are produced by depositing a carbon coating on a smooth surface of a target which also may be ion beam sputter bombarded simultaneously. This carbon deposition is produced by a vacuum arc between a graphite rod cathode and an annular carbon anode that are connected to a suitable power supply.

With such apparatus, the arc may seat itself initially at the downstream end of the cathode and produce high density diamondlike carbon flakes at a rapid rate. However, with time the anode itself becomes covered with flakes which results in the arc seating itself at other than the downstream end of the cathode. Such a change in the hot site of electron emission from the cathode results in a great reduction in the rate of diamondlike carbon deposition on the target. Also, the density of the diamondlike carbon flakes is at its maximum if these flakes are deposited from an arc that is seated at the downstream end of the cathode.

Although it is possible to collect flakes from an arc that has seated on the cathode at a location other than at the downstream end, the density of the flakes is greatly reduced. Therefore, for optimum results, the arc must seat on the downstream end of the cathode.

It is, therefore, an object of the present invention to provide improved apparatus for making carbon flakes having diamondlike properties. Another object of the invention is to provide an improved cathode for making diamondlike carbon flakes in which the seating of the arc is confined to the end of the cathode to ensure a high rate of deposition of high quality diamondlike carbon on a target.

BACKGROUND ART

Aiesenberg U.S. Pat. No. 3,961,103 discloses the deposition of a carbon-diamond film on a substrate by ionizing and electrostatically accelerating a beam of atomic particles of carbon. A plasma ion source using silicon electrodes produces plasma which contains large concentrations of ions of the species that is to be deposited on the substrate.

Nelson et al U.S. Pat. No. 4,191,735 discloses a method for producing synthetic diamonds utilizing an ion source from which ions of carbon and oxygen are extracted and passed through a magnetic field. The ion source includes a tungsten filament disposed within a solid graphite block. The magnetic field separates the carbon and oxygen beams by virtue of the different masses. A flux of carbon ions is thus produced having a sufficient energy to penetrate a diamond crystal and cause crystal growth which is predominantly internal.

Banks U.S. Pat. No. 4,437,962 is directed to the method of making diamondlike flake composites in which a carbon coating is vacuum arc deposited on a target which is simultaneously ion beam sputtered. The vacuum carbon arc is formed between a carbon rod cathode and an anode so that carbon vapor as well as carbon ions leave the cathode.

DISCLOSURE OF INVENTION

Diamondlike carbon flakes are produced by the deposition of carbon from a beam containing carbon ions and atoms onto a smooth surface that is simultaneously ion beam sputtered. The bombarding ions have sufficient energy to create diamond bonds. As the carbon deposit on the target thickens, diamondlike carbon flakes spall from the target surface.

The beam results from a vacuum arc between a cathode and anode within a vacuum. Provision is made to confine the vacuum arc spot to the face on the outermost end of the cathode. This spot is restrained from wandering to the sides of the cathode which would lower the rates of carbon deposition and alter the properties of the flakes.

BRIEF DESCRIPTION OF THE DRAWING

The details of the invention will be described in connection with the accompanying drawings in which.

BEST MODE FOR CARRYING OUT THE INVENTION

Figure 1:
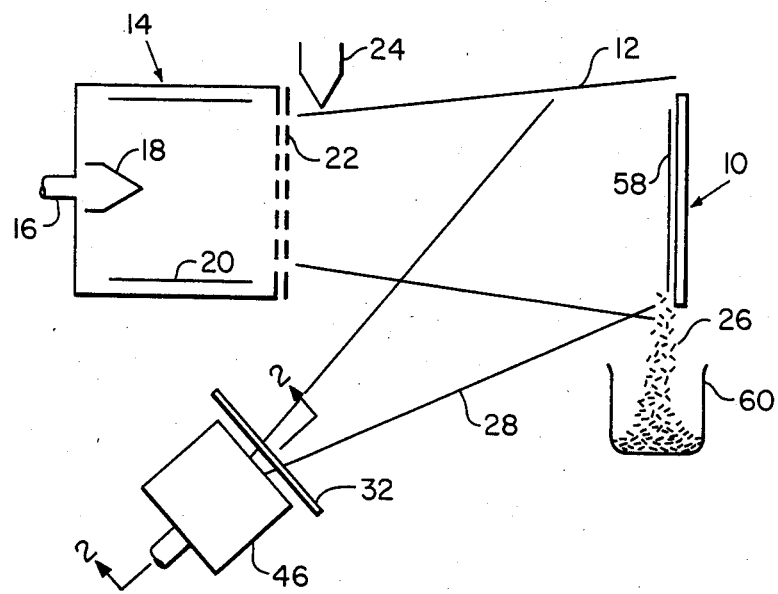
FIG. 1 is a schematic view showing apparatus constructed in accordance with the present invention for producing diamondlike carbon flakes.

Referring now to the drawings, there is shown in FIG. 1 a target 10 that is exposed to a beam 12 of 50 eV to 3000 eV argon ions at current densities of 0.1 mA/cm$^2$ to 20 mA/cm$^2$. The argon ion beam 12 is furnished by an electron bombardment ion source 14 of the type developed from electric propulsion technology.

Argon gas from a suitable source, not shown, is fed through a line 16 to a cathode 18 where the gas is ionized. The argon ions are retained within a chamber containing an anode 20 about its outer periphery. Such an ion source is described in "Advances in Electronics and Electron Physics" by H. R. Kaufman, vol. 36, pages 265-373 (1974). It will be appreciated that other gasses, in addition to argon, can be used to form the bombarding ions in the beam 12. For example, xenon and hydrogen may be used, and even vaporized carbon may be provided in the ion source 14.

Extraction of the beam 12 is accomplished by a two grid ion optics system 22. Such a system is described in AIAA Paper No. 76-1017 entitled "A 30 cm Diameter Argon Ion Source". This double grid system includes both a screen grid and an accelerator grid. The screen grid serves to contain the discharge plasma while forming the necessary ion optics to prevent direct impingement of accelerated ions onto the accelerator grid. Ions in the near vicinity of the screen grid have a high probability of being accelerated through the openings in the screen and the accelerator grids because of the high electric fields present at the grids.

Neutralization of the ions is achieved by the interjection of electrons into the beam 12. A suitable neutralizer 24 in the form of a downstream cathode provides these electrons.

The electron bombardment ion source 14 is located in a vacuum facility which is sufficiently large to prevent back sputtered facility material from contaminating the process. The operating pressure within the vacuum facility during sputtering is about $1 \times 10^{-4}$ torr or lower. Diamondlike carbon flakes 26 are produced by carbon deposition on a smooth surface of the target 10 that is simultaneously being ion beam sputter bombarded by the beam 12 as described in copending application Ser. No. 591,089 now U.S. Pat. No. 3,904,505. This carbon deposition is produced by a beam 28 of carbon ions and atoms.

Figure 2:
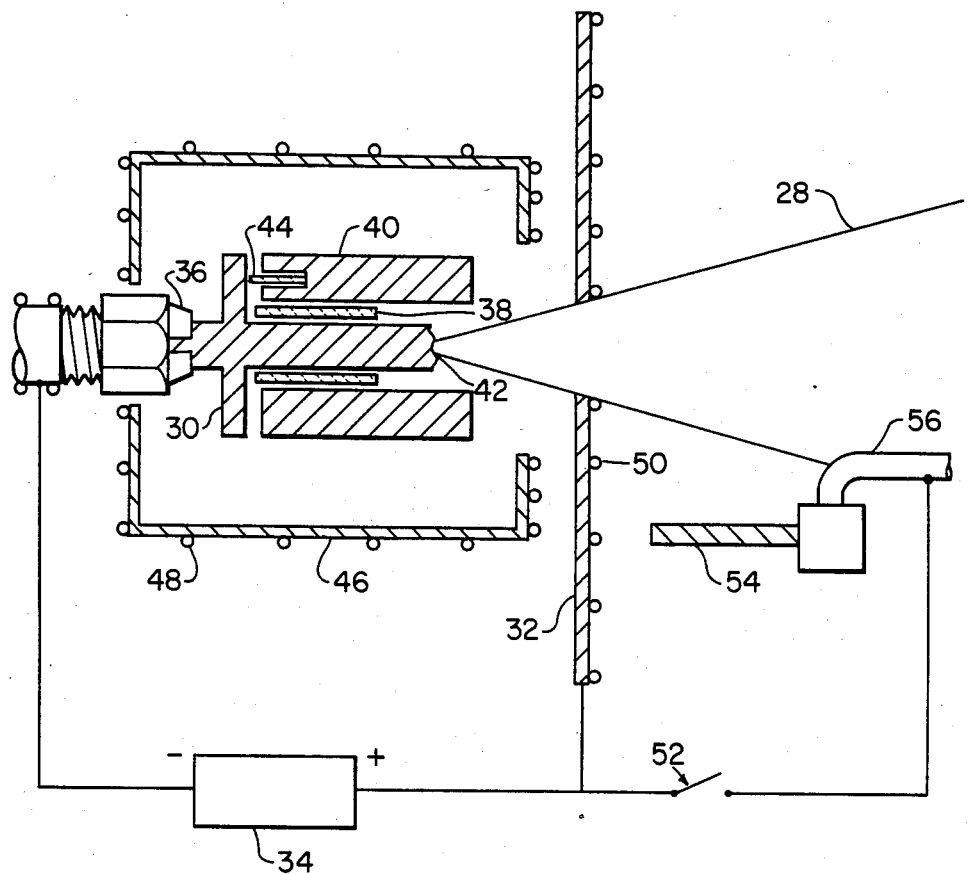
FIG. 2 is a half section view taken along the line 2—2 in FIG. 1 showing the apparatus in the operating mode.

Referring now to FIG. 2, the beam 28 results from a vacuum arc between a graphite cathode 30 and an annular graphite anode 32 that are connected to a suitable power supply 34. A graphite rod 30 having a diameter of $\frac{1}{2}$ inch and $2\frac{1}{4}$ inch length has been satisfactory. The inside diameter of the central aperture in the annular anode 32 may be between about $\frac{1}{2}$ inch and about 1 inch for optimum results. This aperture is in substantial alignment with the cathode 30.

A copper or brass collet 36 is used to ensure good electrical and mechanical contacts with the cathode 30. As shown in FIG. 2 the power supply 34 is in electrical contact with both the cathode 30 and the anode 32.

An aluminum oxide insulating sleeve 38 having an outside diameter of about $\frac{5}{8}$ inch and a length of about $\frac{5}{8}$ inch is provided to electrically isolate the cathode 30 from a graphite tubular member 40. It will be apparent from FIG. 2 that the spacing between the extreme outermost end of the tubular member 40 and the anode 32 is less than the spacing between the end of the cathode 30 and the anode 32. The purpose of the outer tube 40 is to force a vacuum arc spot 42 to be confined to the surface on the outermost end of the cathode 30 which faces toward the target 10. A graphite tube 40 having an inside diameter of about $\frac{5}{8}$ inch, a 1 inch outside diameter, and a length of about $1\frac{1}{4}$ inches has been satisfactory.

If the tubular member 40 is not present the arc cathode spot 42 will wander to the side of the cathode 30 that faces away from the target 10. This movement of the cathode spot 42 results in low rates of carbon deposition, and the properties of the flakes 26 are more graphitelike than diamondlike.

An insulator rod 44 of aluminum oxide is mounted on the end of the outer cylinder 40 to electrically isolate the cathode 30 from the arc spot confining cylinder 40 by axial separation. A 1/16 inch rod having a length of about $\frac{3}{8}$ inch has been satisfactory. If both the graphite cathode 32 and the graphite cylinder 40 are permitted to electrically contact each other, the arc spot 42 will wander or transfer to the outer cylinder 40 and again produce low quality flakes.

High heat levels between about 2000 watts and 5000 watts are produced with this apparatus. Therefore, the cathode 30 and related structure are enclosed within a copper housing 46 that is cooled by a water jacket 48.

Electrons flow from the cathode spot 42 that is confined to the outermost end of the cathode 30 to the anode 32. A water jacket 50 is brazed to the anode 32.

Figure 3:
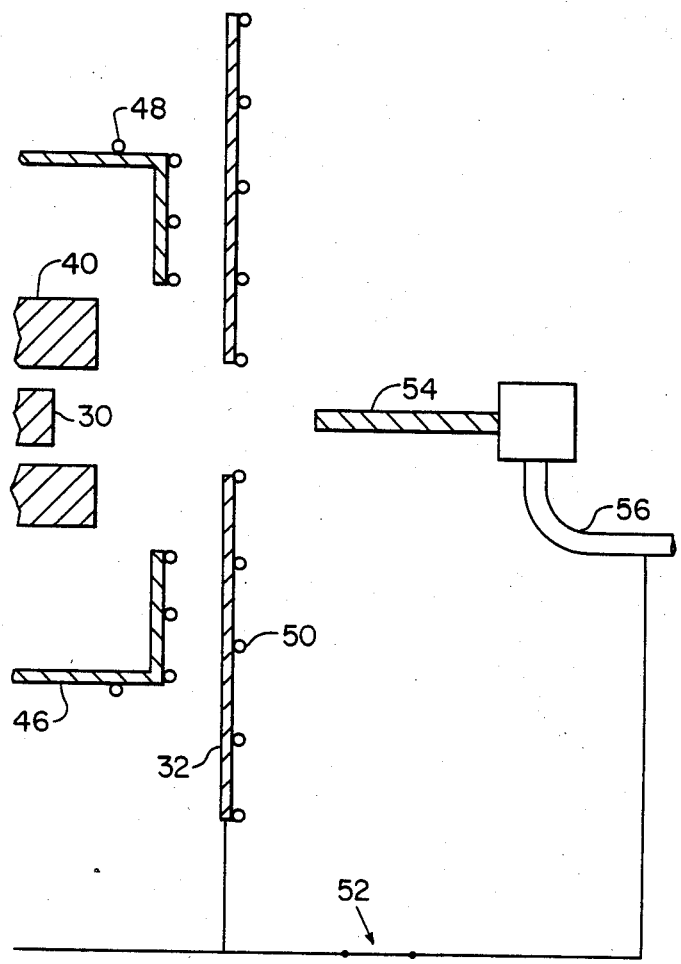
FIG. 3 is a partial half section view similar to FIG. 2 showing the apparatus in the start-up mode.

The arc is ignited by shorting an ignitor switch 52 and rotating a graphite tipped ignitor electrode 54 into a position shown in FIG. 3 wherein the electrode 54 is aligned with both the cathode 30 and the aperture in the anode 32. The electrode 54 is then moved through the anode aperture toward the cathode 30 by a suitable push rod 56 to short this electrode to the cathode. Once contact is made the ignitor electrode 54 is moved away from the cathode 30 and then rotated to the position shown in FIG. 2 which is out of the flow of energetic carbon ions and atoms. The ignitor switch 52 is then opened. A graphite tip having a diameter of about $\frac{1}{4}$ inch and a length of about 3 inches has been satisfactory for the electrode 54.

The graphite cathode 30 and anode 32 are positioned within the vacuum chamber. The target 10 is positioned within 50 centimeters of both the ion source 14 and the arc produced by the electrodes 30 and 32.

The vacuum carbon arc has a low voltage between 20 and 40 volts produced by the power supply 34. This arc also has a high current discharge between 25 and 200 amperes. It is contemplated that automatic feed means may be provided for the cathode 30 to maintain the arc.

In operation carbon vapor as well as carbon ions will leave the tip of the cathode 30, and a portion of these will arrive at the deposition surface of the target 10 and remain there. The bombarding argon ions in the beam 12 have sufficient energy to create diamond $sp^3$ bonds in a carbon coating 58 that is deposited by the vacuum arc. As the deposited carbon 58 thickens on the deposition target 10, spalling will occur due to the stresses in this deposit.

The spalled flakes 26 are then collected as they fall into a receiving container 60. The flakes 26 will vary from less than 0.1 microns in thickness to several microns thick. The shapes of the flakes 26 are normally random; however, it is contemplated that a texture patterned or embossed deposition target 10 may provide some control of the flake shape and size.

The collected flakes may be mixed with or joined by a matrix or binder in a manner described in U.S. Pat. No. 4,437,962. A variety of low viscosity organic binders, such as epoxys, may be used.

It is evident that extremely hard diamondlike carbon flakes 26 are produced by this process, rather than softer and lower strength graphite. The unique properties of diamondlike carbon flakes are relied on for improved properties in various applications, such as the aforementioned superior composite materials.

While a preferred embodiment of the invention has been disclosed and described it will be apparent that various modifications may be made to the apparatus without departing from the spirit of the invention or the scope of the subjoined claims.

I claim:

1. In apparatus for making diamondlike carbon flakes wherein carbon is deposited on a target that is ion sputtered in a vacuum environment, an improved carbon source comprising a cylindrical graphite cathode having a curved peripheral surface terminating at a substantially planar end surface facing towards said target, a graphite anode positioned between said cylindrical cathode and said target, means for establishing an electrical arc between a cathode spot on said planar end surface of said cathode and said anode thereby generating a flow of carbon ions and atoms towards said target, and means for confining said cathode spot to said planar end surface of said cylindrical cathode thereby inhibiting movement of said cathode spot to said curved peripheral surface of said cathode from said planar end surface.

2. Apparatus as claimed in claim 1 wherein said cathode spot confining means comprise a tubular member surrounding said cathode in a fixed spaced relationship thereto.

3. Apparatus as claimed in claim 2 wherein said cathode spot confining means comprises a graphite tubular member and said cathode comprises a graphite rod mounted within the bore of said tubular member.

4. Apparatus as claimed in claim 3 wherein the spacing between the extreme outermost end of the tubular member and the anode is less than the spacing between the end surface of said cathode and said anode.

5. Apparatus as claimed in claim 4 including means for electrically isolating said tubular member from said cathode.

6. Apparatus as claimed in claim 5 wherein the electrically isolating means includes an insulating sleeve interposed between said tubular member and said cylindrical cathode for maintaining a fixed spaced relationship between the inner surface of said tubular member and the curved peripheral surface of said cathode, and an insulating rod extending from the end of said tubular member facing away from said anode toward an outwardly extending portion of said cathode for maintaining a fixed axial separation between said end of said tubular member and said outwardly extending portion of said cathode.

7. Apparatus as claimed in claim 6 wherein said insulating sleeve and said insulating rod are aluminum oxide.

8. Apparatus as claimed in claim 1 including means for cooling said cathode spot confining means and said cathode.

9. Apparatus as claimed in claim 8 wherein the cooling means comprises a fluid cooled housing enclosing said cathode spot confining means and said cathode.

10. Apparatus as claimed in claim 1 including means for cooling said anode.

11. Apparatus as claimed in claim 10 including an annular anode having a centrally disposed aperture in substantial alignment with said cathode, and a water jacket in thermal contact with said annular anode.

12. Apparatus as claimed in claim 11 wherein said arc establishing means comprises an electrode in selective electrical contact with said anode, and means for selectively moving said electrode into alignment with said aperature wherein said electrode is in substantial alignment with said cylindrical cathode and inserting said electrode through said aperture into electrical contact with said planar end surface for shorting said anode and said cathode to establish said arc.

13. Apparatus as claimed in claim 12 wherein the electrode moving means comprises a member secured to said electrode, said member being mounted for rotative movement whereby the electrode is moveable to a first position in alignment with said anode aperature prior to establishing said arc and to a second position out of said flow of carbon ions and atoms after said arc is established.

14. Apparatus as claimed in claim 13 wherein the member secured to the electrode is mounted for reciprocable movement when said electrode is rotated to said first position for inserting and withdrawing said electrode into and out of said aperture.

15. In combination with a cylindrical graphite cathode for producing a beam of carbon ions and atoms with a vacuum arc from a cathode spot at the face on the outermost end thereof to an anode, means for confining said cathode spot to said face so that said cathode spot is restrained from wandering to a curved peripheral surface on the side of said cylindrical cathode, said means comprising a graphite tubular member surrounding said cylindrical cathode in fixed spaced relationship, said tubular member having an outermost end spaced closer to said anode than the spacing between said anode and said face on the end of said cylindrical cathode.

16. Apparatus as claimed in claim 15 including means for electrically isolating said cylindrical tubular member from said cathode.

17. Apparatus is claimed in claim 16 wherein the electrically isolating means includes an insulating sleeve interposed between said tubular member and said cathode for maintaining a fixed spaced relationship between the inner surface of said tubular member and the curved peripheral surface on said cathode, and an insulating rod extending from the end of said tubular member facing away from said anode toward an outwardly extending portion of said cathode for maintaining a fixed axial separation between said end of said tubular member and said cathode.

18. Apparatus as claimed in claim 17 wherein said insulating sleeve and said insulating rod are aluminum oxide.

* * * * *